United States Patent [19]

Anand et al.

[11] Patent Number: 5,089,433

[45] Date of Patent: Feb. 18, 1992

[54] BIPOLAR FIELD-EFFECT ELECTRICALLY ERASABLE PROGRAMMABLE READ ONLY MEMORY CELL AND METHOD OF MANUFACTURE

[75] Inventors: Kranti V. Anand; Madhu Anand, both of Sunnyvale, Calif.

[73] Assignee: National Semiconductor Corporation, Santa Clara, Calif.

[21] Appl. No.: 647,185

[22] Filed: Jan. 24, 1991

Related U.S. Application Data

[60] Division of Ser. No. 489,759, Feb. 27, 1990, abandoned, which is a continuation of Ser. No. 229,940, Aug. 8, 1988, abandoned.

[51] Int. Cl.[5] ......................................... H01L 21/265
[52] U.S. Cl. ..................................... 437/40; 437/43; 357/23.5
[58] Field of Search .................... 357/23.5, 43, 59; 437/43

[56] References Cited

U.S. PATENT DOCUMENTS

| | | | |
|---|---|---|---|
| 4,019,197 | 4/1977 | Lohstroh et al. | 357/23.5 |
| 4,035,820 | 7/1977 | Matzen | 357/23.9 |
| 4,221,045 | 9/1980 | Godejahn, Jr. | 357/23.9 |
| 4,326,331 | 4/1982 | Guterman | 437/43 |
| 4,373,248 | 2/1983 | McElroy | 437/43 |
| 4,398,338 | 8/1983 | Tickle et al. | 357/92 |
| 4,425,631 | 1/1984 | Adam | 357/23.5 |
| 4,526,147 | 5/1985 | Komatsu et al. | 357/59 |
| 4,533,934 | 8/1985 | Smith | 357/23.9 |
| 4,604,535 | 8/1986 | Sasayama et al. | 357/43 |
| 4,612,212 | 9/1986 | Masuoka et al. | 437/43 |
| 4,642,673 | 2/1987 | Miyamoto et al. | 357/41 |
| 4,697,199 | 9/1987 | DeGraaff et al. | 357/43 |
| 4,824,796 | 4/1989 | Chiu et al. | 357/43 |
| 4,924,437 | 5/1990 | Paterson et al. | 437/43 |

FOREIGN PATENT DOCUMENTS

| | | | |
|---|---|---|---|
| 0054668 | 3/1983 | Japan | 357/23.5 |
| 0125677 | 6/1987 | Japan | 437/43 |
| 0067783 | 3/1988 | Japan | 357/23.5 |
| 0179578 | 7/1988 | Japan | 437/43 |

*Primary Examiner*—Olik Chaudhuri
*Assistant Examiner*—Long Pham
*Attorney, Agent, or Firm*—Townsend and Townsend

[57] ABSTRACT

A floating gate electrically erasable MOS transistor comprising a silicon substrate having source and drain regions and a channel region disposed between the source region and the drain region. The source and drain regions are formed from a semiconductor material having one conductivity type, and the channel region is formed from a semiconductor material having a conductivity type opposite the conductivity type of the semiconductor material forming the source and drain regions. A control gate region is formed in the silicon substrate horizontally spaced apart from the channel region. The gate region is formed from a semiconductor material having the same conductivity type as the semiconductor material forming the source and drain regions. A polysilicon layer bridges the control gate region and the channel region for communicating an electrical potential from the first gate region to the channel region. A silicon dioxide layer is disposed between the polysilicon layer and the control gate and channel regions for insulating the polysilicon layer from these regions. The polysilicon layer thus serves the function of a floating gate, and is selectively controlled through the first gate region for forming a conductive channel between the source and drain regions. The drain region of the MOS transistor is coupled to the base terminal of a bipolar sensing transistor for forming an EEPROM.

19 Claims, 9 Drawing Sheets

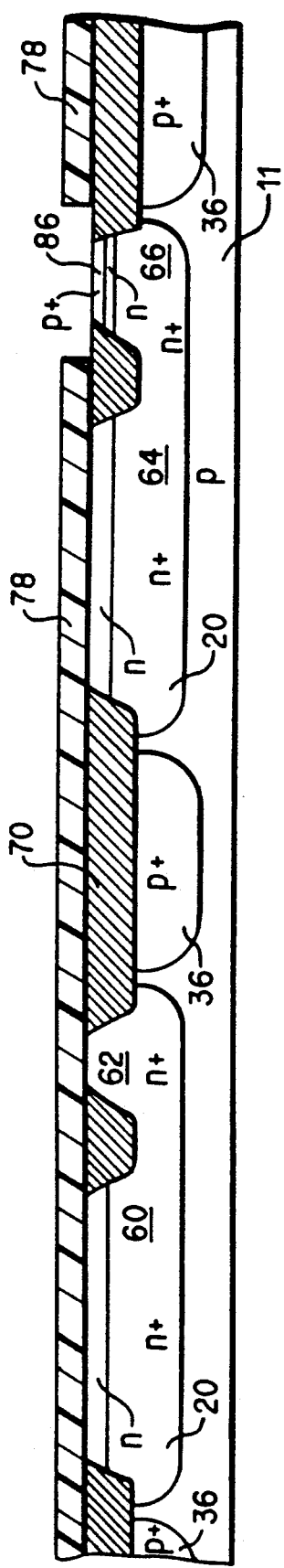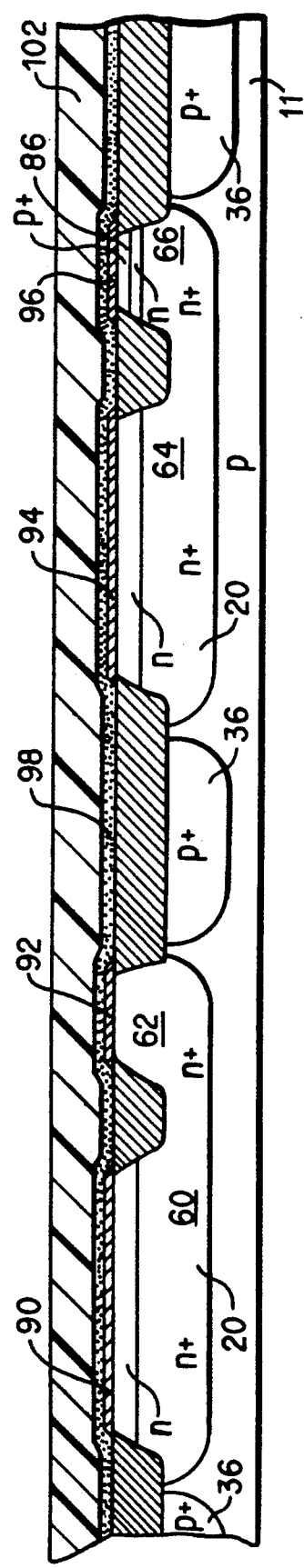

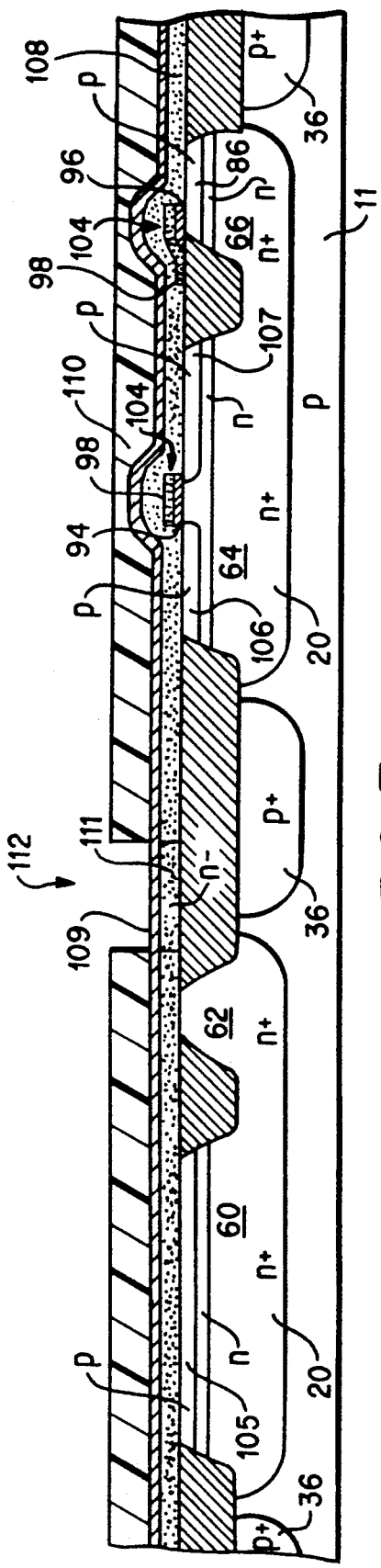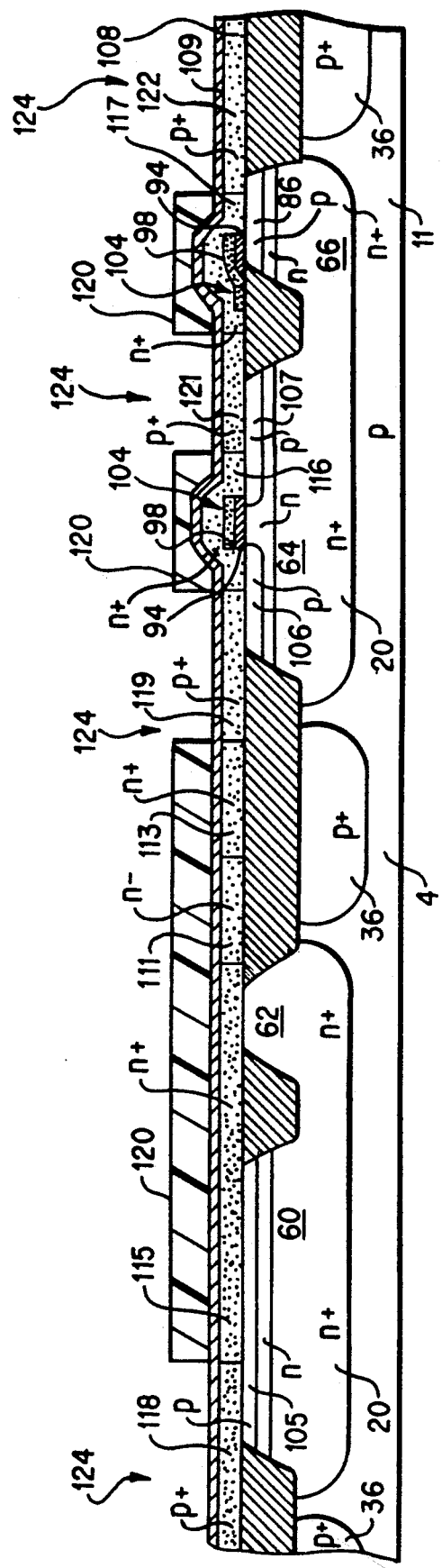

BIPOLAR FIELD-EFFECT ELECTRICALLY ERASABLE PROGRAMMABLE READ ONLY MEMORY CELL AND METHOD OF MANUFACTURE

This is a division of application Ser. No. 07/489,759, filed Feb. 27, 1990, now abandoned, which is a continuation of application Ser. No. 07/229,940, filed Aug. 8, 1988, now abandoned.

BACKGROUND OF THE INVENTION

1. Field Of The Invention

This invention relates to a floating gate MOS transistor and, more particularly, to a floating gate MOS transistor constructed with a single layer of polysilicon which allows the MOS transistor to be fabricated with and coupled to a bipolar sensing transistor for forming a high speed, reprogrammable EEPROM.

2. Description of The Relevant Art

Conventional programmable memory elements can be divided into two categories: MOS devices and bipolar devices. In the first category, a floating gate MOSFET is combined with other MOSFETS which act as the active sensing devices. The floating gate MOSFET is reprogrammable, but EEPROMS fabricated with MOS devices are inherently slow. In the second category, bipolar integrated circuit non-volatile memory cells are usually constructed using some variation of a fuse technology. That is, each possible current path through the device comprises a fuse which is selectively blown to provide a permanently programmed device. One disadvantage of this technology is that the circuits require a large current to blow the fuse. Bipolar integrated circuits also have the disadvantage that, since they are programmed by blowing fuses, they are not reprogrammable, and the devices cannot be test-programmed without destroying them for other purposes.

Unfortunately, significant structural differences exist between bipolar devices and MOS devices, precluding the techniques used for fabrication of one type of device from being used to fabricate the other type of device. For example, the thin gate oxide and interpoly oxide layers used in conventional floating gate MOS devices are subject to contamination and mechanical damage when formed by bipolar fabrication methods, and the performance of bipolar devices frequently suffers when subjected to MOS fabrication methods. Consequently, the combination of technologies has not been successfully realized.

SUMMARY OF THE INVENTION

The present invention is directed to a floating gate MOSFET memory device and to such a device fabricated with and coupled to a fast bipolar transistor for forming an EEPROM cell or a programmable logic device. The combined bipolar/MOS technology allows the memory device to be read at bipolar speeds while also allowing MOSFET reprogrammability. Unlike conventional floating gate memory MOSFETS which require at least two layers of polysilicon separated by an interpoly oxide, the MOSFETS fabricated according to the present invention require only a single layer of polysilicon deposited in a two-step process. Thus, both the bipolar and MOS devices may be fabricated using a single polysilicon layer process which provides high yields. Additionally, despite the inclusion of an MOS device, the fabrication process according to the present invention does not compromise the performance of the bipolar devices.

In one embodiment of the present invention, the drain of an electrically erasable floating gate P-channel MOSFET device is connected to the base of an NPN transistor for forming an EEPROM cell. The device is read by sensing the current flowing through the bipolar device, but the device is written into and erased by applying an appropriate voltages to the MOSFET. Since each cell is rarely written into (or erased), but read often, inclusion of the slower MOS device is quite acceptable.

Both devices are constructed on the same silicon substrate using a single fabrication process. The floating gate MOS transistor is constructed by doping spaced apart source and drain regions of the substrate to a first conductivity type. An opposite conductivity type channel region is disposed between the source region and the drain region. A first (control) gate region is formed in the silicon substrate horizontally spaced apart from the channel region. The first gate region is formed by doping semiconductor material to the same conductivity type as the source and drain regions. A polysilicon layer, disposed over a silicon dioxide layer, bridges the first gate region and the channel region for communicating an electrical potential from the first gate region to the channel region. The polysilicon layer thus serves as a second (floating) gate region and is controlled through the first gate region to selectively form a conductive channel between the source and drain regions. Although the resulting MOS device has a somewhat larger area than conventional floating gate MOS devices, the high integrity gate oxide used to isolate the floating gate from both the channel region and the control gate region eliminates the problem of integrity of the interpoly oxide in conventional MOS devices.

These and other features and advantages of the invention will become apparent to those skilled in the art upon a reading of the following detailed description of the invention, which should be taken in conjunction with the accompanying drawings.

BRIEF DESCRIPTION OF THE DRAWINGS

FIGS. 3-13 illustrate the steps for forming a floating gate MOS transistor and bipolar transistor according to the present invention.

DETAILED DESCRIPTION OF THE PREFERRED EMBODIMENT

Figure 1:
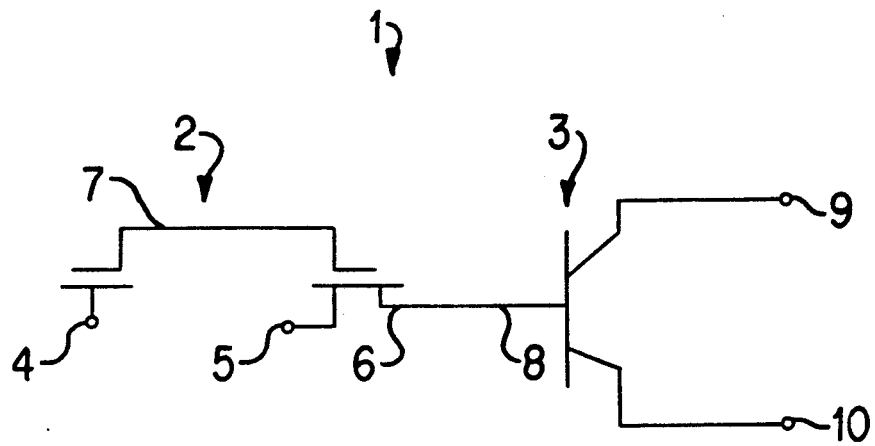
FIG. 1 is a schematic of an electrically erasable floating gate MOSFET device, according to the invention, connected to a bipolar transistor.

FIG. 1 is a schematic diagram of an electrically erasable programmable read only memory (EEPROM) cell 1 according to the present invention. EEPROM cell 1 comprises a P-channel floating gate MOSFET device 2 connected to a bipolar transistor 3. MOSFET 2 includes a control gate terminal 4, a source terminal 5, a drain terminal 6, and a floating gate 7. The drain terminal 6 of MOSFET 2 is connected to a base terminal 8 of bipolar transistor 3 for controlling the operation of bipolar transistor 3. Bipolar transistor 3 includes a collector terminal 9 and an emitter terminal 10.

For high speed, EEPROM cell 1 is read by sensing the collector/emitter current or impedance of bipolar transistor 3. On the other hand, when writing into or erasing the device, communication is with MOSFET 2. Since each cell is rarely written into (or erased), but read often, inclusion of the slower MOS device is quite acceptable. Preferably, avalanche injection, from either the source or the drain PN junction of MOSFET 2, is used for writing, and tunneling is used for erasing. That is, for writing into the device, a large programming voltage (e.g. approximately $-10V$) is applied to the drain terminal 6 of MOSFET 2, and a relatively small negative voltage (e.g. $-2V$) is applied to the control gate terminal 4. The voltage applied to control gate terminal 4 should be above the threshold value of the device. Under these conditions, MOSFET 2 is biased in a heavily conducting state with an electron-inversion layer carrying current from source to drain. When this electron flow enters and crosses the drain depletion layer, it encounters a very high electric field. A small fraction of the carriers gain enough energy from this field to overcome the oxide potential barrier at the silicon surface and drift to the floating gate. This injection builds up an excessive negative charge on the floating gate, forming the channel between the source and drain, and current continually flows from source to drain. Thus, when the device is written into, bipolar transistor 3 will be on, and collector terminal 9 and emitter terminal 10 of bipolar transistor 3 will be at a low impedance.

For erasing the device, a strong negative potential (e.g. $-10V$) is applied to control gate 5, and the source and drain terminals are maintained at approximately zero potential. This gives the electrons in the floating gate enough energy to overcome the potential barrier of the oxide surface and to drift back to the silicon substrate. Once erased, the excess electron density on the floating gate returns to zero, and no current flows from source to drain. Thus, in the erased state, bipolar transistor 3 will be off, and collector terminal 9 and emitter terminal 10 will be at a high impedance.

Figure 2:
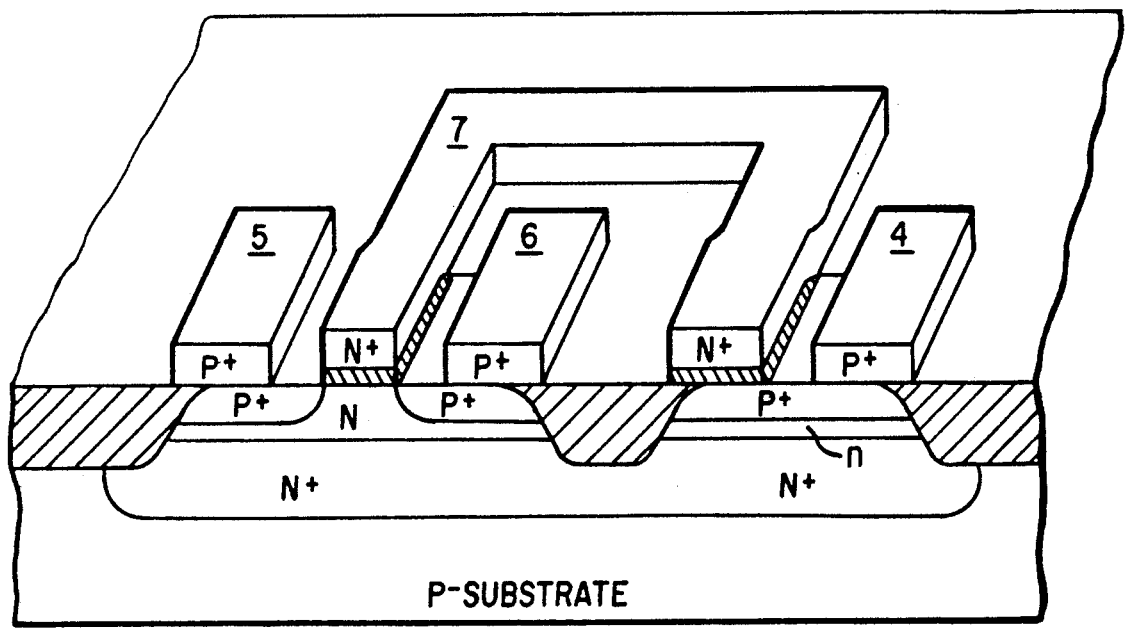
FIG. 2 is a cross-sectional perspective view of a floating gate MOS transistor according to the present invention.

FIG. 2 is a cross-sectional perspective view of the floating gate MOSFET 2 showing the general structure of the device, with the numbering of components the same as in FIG. 1. The method of fabrication of MOSFET 2, together with bipolar device 3, shall now be described with reference to FIGS. 3-13.

Figure 3:
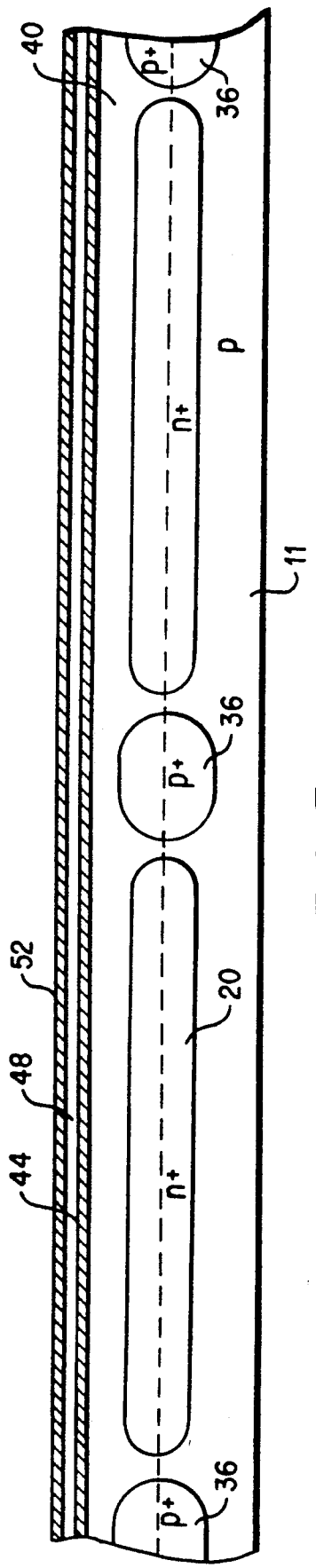

FIG. 3 shows a P-type silicon substrate 11 after having undergone preliminary processing according to conventional methods. First, substrate 11 is subjected to an initial oxidation step by being placed in a steam environment at about 1000° C. for approximately 125 minutes to form an oxide layer (not shown) having a thickness of approximately 6050 angstroms. A layer of photoresist is deposited and developed according to well known photolithographic techniques to define openings where buried layer 20 will be formed. The oxide is removed by a combination of wet and dry etching to expose substrate 11. The photoresist layer is removed, and the exposed portions of the substrate are reoxidized in steam at about 850° C. for approximately 20 minutes to form an oxide layer of approximately 300 Angstroms thick. The buried N-type layers then are implanted with arsenic, at an implantation energy of approximately 80 KeV to a dose of approximately $5 \times 10^{15}$ atoms/cm$^2$. Next, substrate 11 is placed in an oxidizing environment at 1100° C. for approximately 60 minutes to anneal the implant and to form N+ regions 20, which will constitute conventional buried layers for the devices to be formed.

The oxide layer is removed and reformed. Another photoresist layer then is deposited and developed to form openings for the P-type regions 36. This area is ion-implanted with boron to form P+ implant regions.

Next, the photoresist is removed, and substrate 11 is annealed to convert the P+ implant regions into P+ field regions 36. The oxide layer is removed, and an N-type epitaxial silicon layer 40 grown by an LPCVD technique. In the preferred embodiment, expitaxial layer 40 has a thickness of approximately 1.3 µm. Then, as shown in FIG. 3, substrate 11 is placed in an oxygen or steam environment at approximately 1000° C. to form oxide layer 44, approximately 200 angstroms thick, and to anneal epitaxial layer 40. Thereafter, a silicon nitride layer 48 is deposited by CVD to a thickness of approximately 1500 angstroms, and a layer of silicon dioxide 52 is formed over silicon nitride layer 48.

Figure 4:
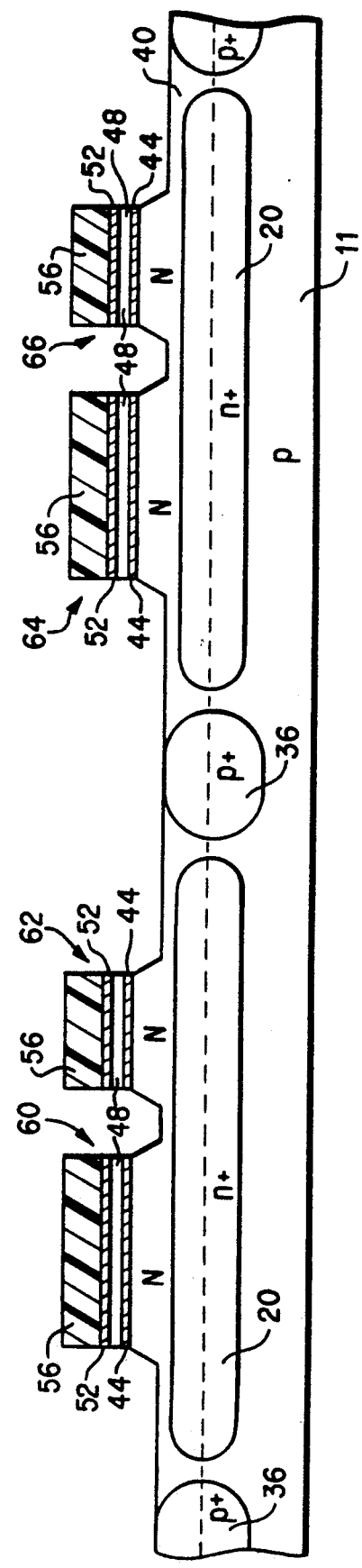

Next, as shown in FIG. 4, a photoresist layer 56 is deposited and developed for leaving the pattern shown. The exposed regions of silicon dioxide layer 52, silicon nitride layer 48, and silicon dioxide layer 44 not covered by photoresist layer 56 are etched. Then, using potassium hydroxide, the epitaxial layer 40 is etched to form islands 60, 62, 64, and 66. Islands 60 and 62 will be used to form bipolar transistor 3, and islands 64 and 66 will be used to form MOSFET 2.

The remaining portions of photoresist layer 56 and silicon dioxide layer 52 are removed. The substrate 11 then is subjected to a high-pressure oxidation to form an oxide layer 70 to a depth of approximately 10,000 angstroms for surrounding islands 60, 62, 64, and 66 (see FIG. 5). Then, nitride layer 48 is removed by etching, and oxide layer 70 is planarized using wellknown techniques to expose the upper surfaces of islands 60, 62, 64, and 66.

As shown in FIG. 5, a photoresist layer is deposited and developed to expose island 62. Then, the collector sink is implanted with phosphorous at an implantation energy of approximately 190 KeV to a dose of approximately $2 \times 10^{15}$ atoms/cm$^2$. The sink implant then is annealed at a temperature of 1000° C. for approximately 60 minutes. At the completion of the process, an N+ collector sink region is formed.

The photoresist layer is removed, and a new photoresist layer 78 is deposited and developed to expose island 66. A P-type ion implant then is performed with boron at an implantation energy of approximately 40 KeV to a dose of approximately $6 \times 10^{14}$ atoms/cm$^2$. This forms a P+ control gate region 86 in island 66. Thereafter, the remaining portions of photoresist layer 78 are removed.

Next, as shown in FIG. 6, a thin gate oxide layer, designated 90, 92, 94, and 96, is grown to a thickness of approximately 150 angstroms over islands 60, 62, 64, and 66 respectively. Over the gate oxide, a thin polysilicon layer 98 is deposited by CVD to a thickness of approximately 500 angstroms. Finally, a photoresist layer 102 is deposited over polysilicon layer 98.

The photoresist layer 102 is exposed and developed to leave portions of photoresist over the areas which will form a single layer polysilicon floating gate 104. Then, polysilicon layer 98 and gate oxide layers 90, 92, 94, and 96 are etched to form part of polysilicon floating gate 104 (see FIG. 7). Although floating gate 104 is shown in FIG. 7 as two separated regions in cross-section, it is actually a continuous layer, as shown in FIG. 2. An unmasked base implant is then performed with boron at an implantation energy of approximately 40 KeV to a dose of approximately $8 \times 10^{12}$ atoms/cm$^2$.

This forms a P-type base region 105 in island 60, and P-type source and drain regions 106 and 107, respectively, in island 64. Not enough P-type impurity is employed to over-compensate the doping of region 62 and, accordingly, it remains doped as an N-type region. Then, photoresist layer 102 is removed.

Next, as shown in FIG. 7, a thick polysilicon layer 108 is deposited by CVD to a thickness of approximately 4500 angstroms, and a thin silicon dioxide layer 109 is formed over polysilicon layer 108. Polysilicon layers 98 and 108 may be considered as first and second sublayers of a larger, single polysilicon layer. Afterward, a photoresist mask 110 is deposited and developed to form an opening 112 over silicon dioxide layer 109 and polysilicon layer 108, where an N- polysilicon region 111 is to be formed. The polysilicon is then implanted with arsenic at an implantation energy of 100 KeV to a dose of approximately $2 \times 10^{15}$ atoms/cm$^2$, and the remaining portions of photoresist layer 110 are removed. The N-region 111 may function as a high value resistor in the completed device.

A photoresist mask is deposited and developed to form openings over silicon dioxide layer 109 and polysilicon layer 108, where N+ polysilicon regions 113, 115, 116, and 117 are to be formed. Thereafter, substrate 11 is subjected to an N+ ion implant with arsenic at an implantation energy of 100 KeV to a dose of approximately $1 \times 10^{16}$ atoms/cm$^2$, and the remaining portions of the photoresist layer are removed. N+ region 113 may serve as a low value resistor or as an ohmic contact to N- region 111. N+ region 115 will serve as the emitter/emitter contact and collection contact in the completed device, whereas N+ regions 116 and 117 will form the remaining part of floating gate 104.

Next, as shown in FIG. 8, a photoresist layer 120 is deposited and patterned to form openings 124 over silicon dioxide layer 109 and polysilicon layer 108, where P+ polysilicon regions 118, 119, 121 and 122 are to be formed. Then, substrate 11 is implanted with boron at an implantation energy of 100 KeV to a dose of approximately $1 \times 10^{15}$ atoms/cm$^2$, and the remaining portions of photoresist layer 120 are removed. P+ region 118 will serve as the extrinsic base contact. P+ regions 119 and 121 will serve a the source and drain contacts, respectively, and P+ region 122 will serve as the control gate contact in the completed device.

Figure 9:
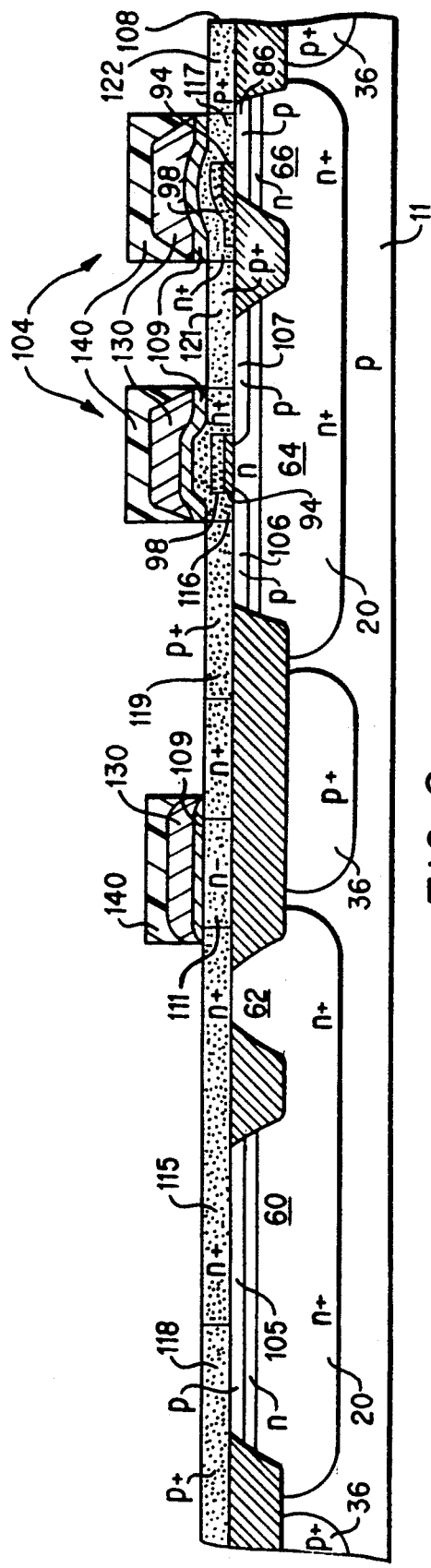

Next, as shown in FIG. 9, a silicon dioxide layer 130 is deposited over silicon dioxide layer 109 by LTO deposition. Substrate 4 then is placed in an oxidizing environment at 800°-900° C. for annealing the previous P+, N- and N+ implants. A layer of photoresist 140 then is deposited and developed for covering the area over polysilicon floating gate 104 and N-region 111. This photoresist mask prevents silicide formation over floating gate 104 and N-region 111 in a later step. The exposed portions of silicon dioxide layers 130 and 109 then are etched to the polysilicon layer 108 as shown, and thereafter the remaining portions of photoresist layer 140 are removed.

Figure 10:
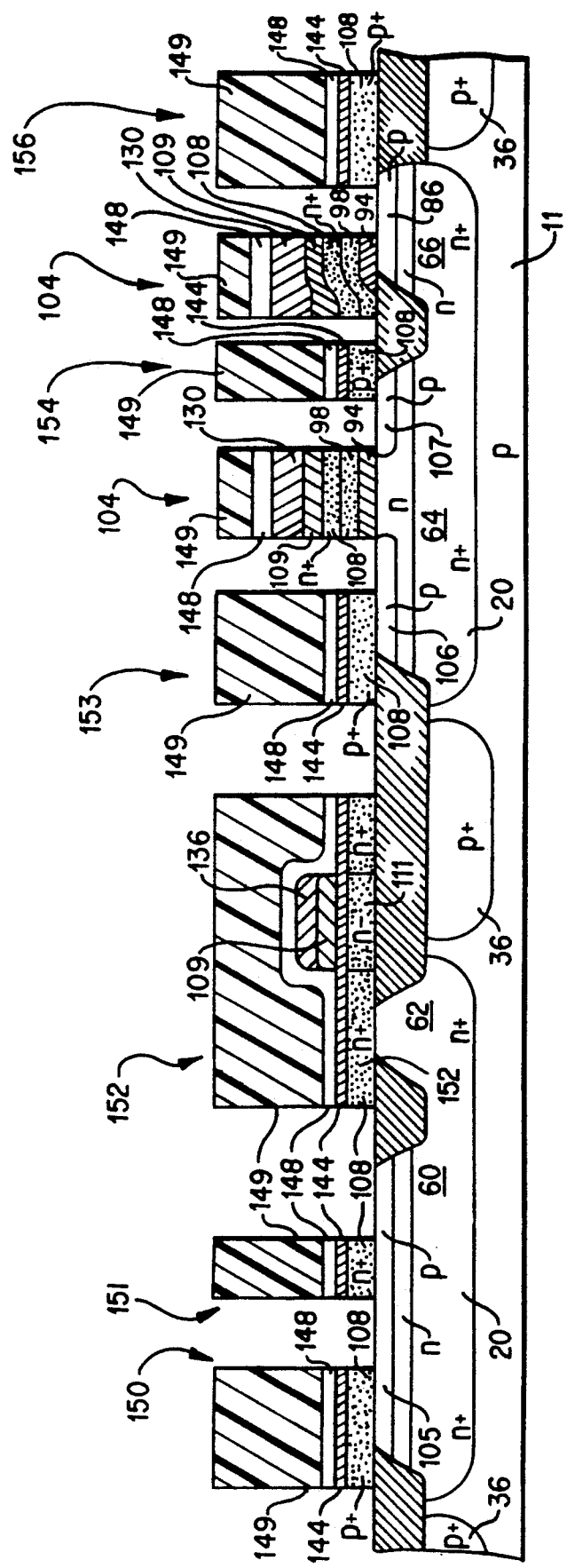

As shown by FIG. 10, Substrate 11 is placed in an oxygen or steam environment for forming a silicon dioxide layer 144 approximately 250 angstroms thick over the exposed portions of polysilicon layer 108. Then, a silicon nitride layer 148 is deposited by CVD as a blanket coating over the structure.

Another photoresist layer 149 is deposited and developed as shown. The portions of photoresist layer 149 remaining define the regions of polysilicon layer 108 where a base contact 150, an emitter contact 151, a collector contact 152, a source contact 153, a drain contact 154, and a control gate contact 156 are to be made to substrate 11. Floating gate 104 also is covered by photoresist layer 149. Thereafter, silicon nitride layer 148, oxide layer 144, and polysilicon layer 108 are etched to leave the portions of these layers shown.

Figure 11:
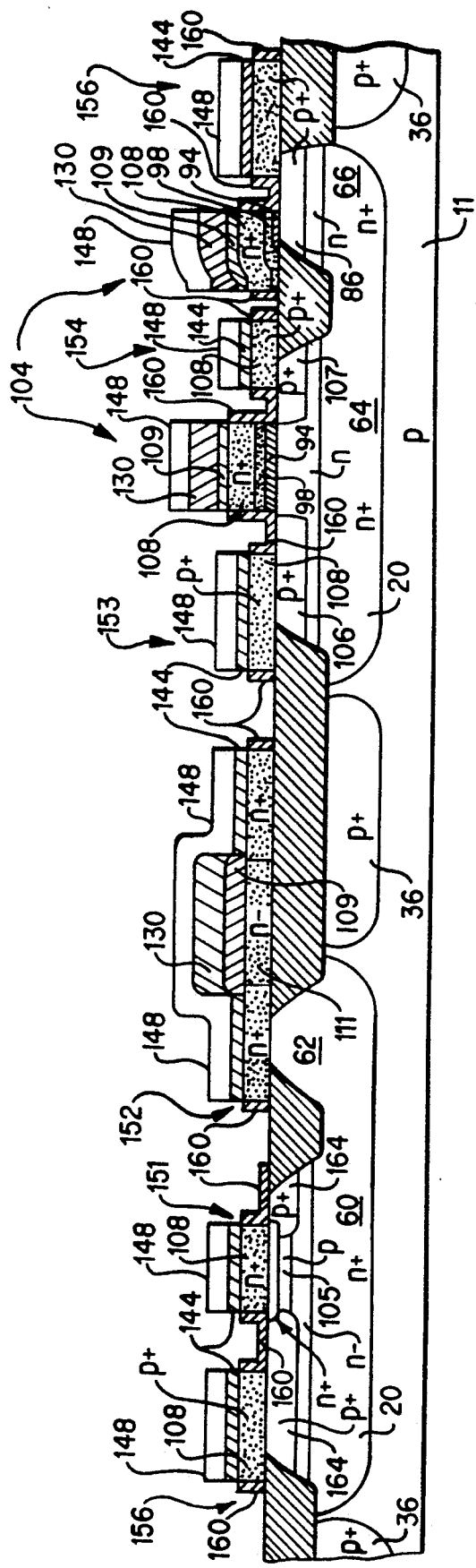

As shown in FIG. 11, the remaining portions of photoresist layer 149 then are removed, and the structure is placed in an oxygen or steam environment for forming an oxide layer 160 having a thickness of approximately 1000 angstroms over the exposed portions of polysilicon layer 108 and the exposed portions of islands 60, 62, 64, and 66. Next, the extrinsic base is implanted with boron difluoride at an implantation energy of approximately 40 KeV to a dose of approximately $4 \times 10^{14}$ atoms/cm$^2$. Thereafter, the structure is subjected to a final implant anneal by placing it in an oxidizing environment at 950° C. for approximately 30 minutes. This anneals P+ regions 164 in island 60. This also anneals source region 106, drain region 107, and control gate region 86.

Figure 12:
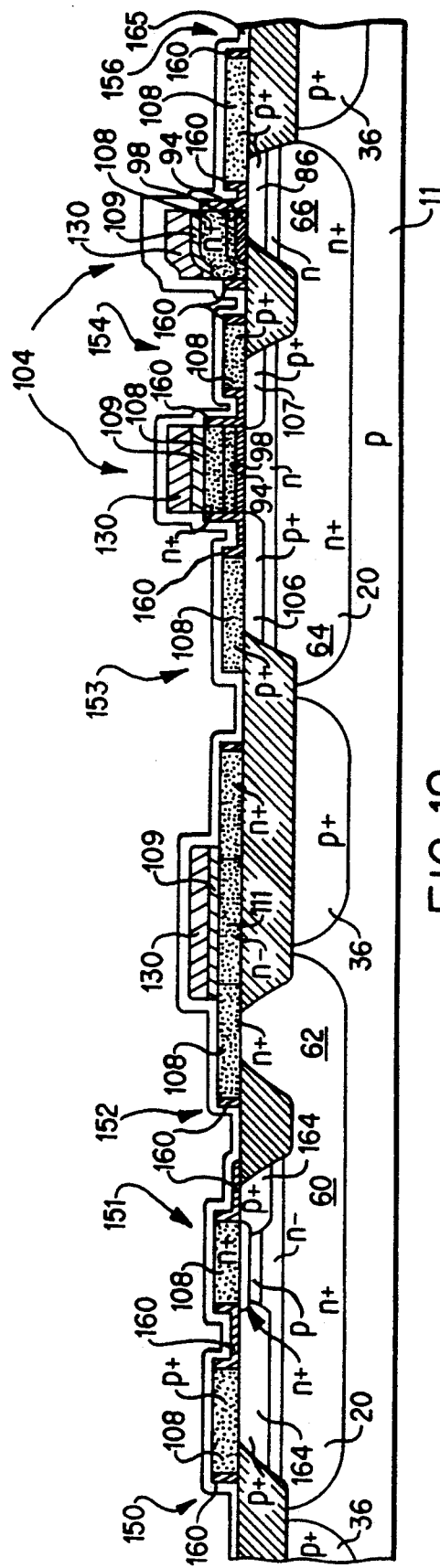

As shown in FIG. 12, the remaining portions of silicon nitride layer 148 and oxide layer 144 are then removed to expose polysilicon layer 108 in base contact 150, emitter contact 151, collector contact 152, source polycontact 153, drain polycontact 154, and control gate polycontact 156. Simultaneously, the thick oxide layer 130, disposed over floating gate 104, is etched to some degree but not completely removed.

Then, as shown further in FIG. 12, a titanium layer 165 is sputtered over the entire structure, and the structure is placed in a rapid thermal annealer to cause titanium layer 165 to react with underlying silicon to form a silicide on the base contact 150, emitter contact 151, and collector contact 152, as well as the source contact 153, drain contact 154, and control gate contact 156. Because of the oxide layers 130 and 109 disposed over floating gate 104 and N-region 111, no silicide reaction occurs there.

Figure 13:
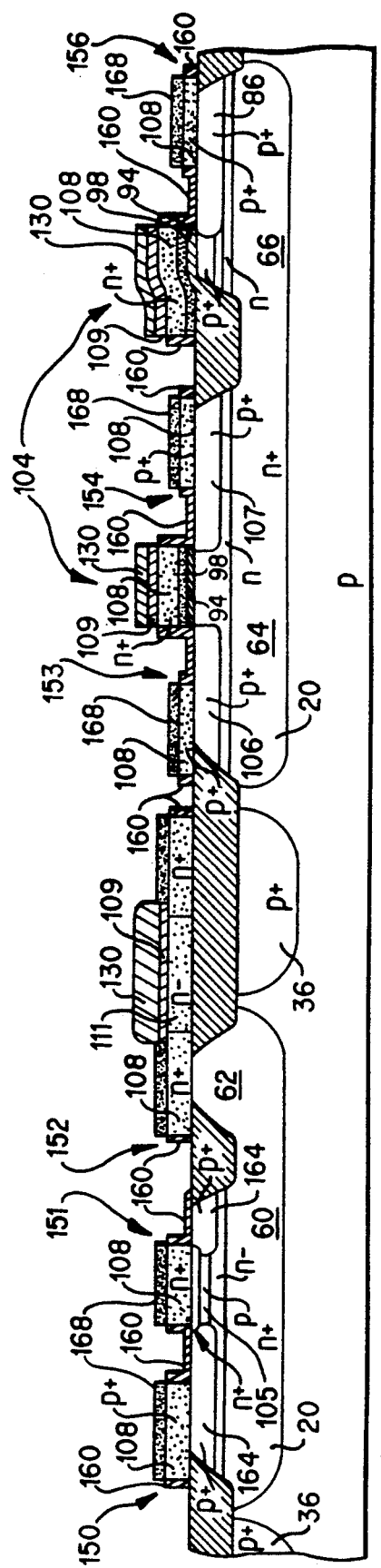

Finally, as shown in FIG. 13, the excess titanium layer 164 is removed by a wet chemical reaction, and the structure is again heat-pulsed for creating a second and final silicide reaction for forming the final silicide layers 168 over base contact 150, emitter contact 151, collector contact 152, source contact 153, drain contact 154, and control gate contact 156. The structure then may be completed using well known contact, metallization, and packaging techniques.

While the foregoing has been a complete description of a preferred embodiment of the present invention, various modifications may be employed. For example, MOSFET 2 may be fabricated alone by omitting those steps unique to bipolar transistor 3. Additionally, MOSFET 2 may be coupled to any number of bipolar or MOS elements, as desired. Consequently, the scope of the invention may be ascertained from the following claims.

We claim:

1. In an MOS transistor comprising a silicon substrate, including source and drain regions formed of a semiconductor material having one conductivity type and a channel region formed of a semiconductor material having a conductivity type opposite the conductivity type of the semiconductor material forming the source and drain regions, the channel region being disposed between and contacting the source and drain regions, a method of making a floating gate electrically erasable MOS transistor comprising the steps of:

forming a control gate region in the substrate generally coplanar with and spaced apart from the channel region, the source region, and the drain region;

growing a layer of silicon dioxide over the channel and control gate regions;

blanket depositing a first polysilicon layer over the substrate; and etching the polysilicon layer and the silicon dioxide layer from the substrate except for a continuous portion of the polysilicon layer extending from the control gate region to the channel region.

2. The method according to claim 1 wherein the etching step comprises the step of:

etching the polysilicon layer and the silicon dioxide layer so that the continuous portion of the polysilicon layer only partially covers the control gate region.

3. The method according to claim 2 wherein the etching step further comprises the step of:

etching the polysilicon layer and the silicon dioxide layer so that the continuous portion of the polysilicon layer completely covers the channel region.

4. The method according to claim 2 further comprising the step of:

depositing a second polysilicon layer over the control gate region.

5. The method according to claim 4 further comprising the step of:

etching the second polysilicon layer for forming a polysilicon contact separated from the bridge and contacting the control gate region.

6. The method according to claim 5 wherein the second polysilicon layer depositing step comprises the step of:

blanket depositing a second polysilicon layer over the substrate.

7. In an MOS transistor comprising a silicon substrate including source and drain regions formed of a semiconductor material having a conductivity type opposite the conductivity type of the semiconductor material forming the source and drain regions, the channel region being disposed between and contacting the source and drain regions, a method of making a floating gate electrically erasable MOS transistor comprising the steps of:

forming a control gate region in the substrate generally coplanar with and spaced apart from the channel region, the source region, and the drain region;

growing a layer of silicon dioxide over the channel region and the gate region;

blanket depositing a first polysilicon layer over the substrate;

etching the first polysilicon layer and the silicon dioxide layer from the substrate except for a continuous portion of the first polysilicon layer extending from the control gate region to the channel region;

blanket depositing a second polysilicon layer over the substrate;

etching the second polysilicon layer from the substrate except for a continuous portion of the second polysilicon layer extending from the control gate region to the channel region over the first polysilicon layer; and wherein the continuous portion of the first polysilicon layer and the continuous portion of the second polysilicon layer define a floating gate.

8. The method according to claim 7 wherein the first polysilicon layer depositing step comprises the step of depositing the first polysilicon layer to a thickness of approximately 500 angstroms, and wherein the second polysilicon layer depositing step comprises the step of depositing the second polysilicon layer to a thickness of approximately 4500 angstroms.

9. The method according to claim 7 wherein the first polysilicon layer etching step comprises the step of etching the first polysilicon layer so that the continuous portion of the first polysilicon layer only partially covers the control gate region, and wherein the second polysilicon layer etching step comprises the step of etching the second polysilicon layer so that the continuous portion of the second polysilicon layer only partially cover the control gate region.

10. The method according to claim 9 wherein the first polysilicon layer etching step comprises the step of etching the first polysilicon layer so that the continuous portion of the first polysilicon layer completely covers the channel region, and wherein the second polysilicon layer etching step comprises the step of etching the second polysilicon layer so that the continuous portion of the second polysilicon layer completely covers the channel region.

11. The method according to claim 9 wherein the second polysilicon layer etching step further comprises the step of etching the second polysilicon layer for forming a polysilicon contact spaced apart from the floating gate and contacting the control gate region.

12. The method according to claim 11 further comprising the steps of:

implanting the control gate region with an impurity having a conductivity type that is the same as the conductivity type of the source region and the drain region;

implanting the portion of the second polysilicon layer defining the floating gate with an impurity having a conductivity type that is opposite the conductivity type of the source region and the drain region; and implanting the portion of the second polysilicon layer contacting the control gate region with an impurity having a conductivity type that is the same as the conductivity type of the source region and the drain region.

13. In an MOS transistor comprising a silicon substrate including source and drain regions formed of a semiconductor material having a conductivity type opposite the conductivity type of the semiconductor material forming the source and drain regions, the channel region being disposed between and contacting the source and drain regions, a method of making a floating gate electrically erasable MOS transistor comprising the steps of, in sequence:

forming a control gate region in the substrate generally coplanar with and spaced apart from the channel region, the source region, and the drain region;

growing a first layer of silicon dioxide over the channel region and the gate region;

blanket depositing a first polysilicon layer over the substrate;

etching the first polysilicon layer and the first silicon dioxide layer from the substrate except for a continuous portion of the first polysilicon layer extending from the control gate region to the channel region;

blanket depositing a second polysilicon layer over the substrate;

forming a second silicon dioxide layer over the second polysilicon layer;

masking the second silicon dioxide layer except over portions of the second silicon dioxide layer covering the continuous portion of the first polysilicon layer;

implanting the second polysilicon layer a first time through the unmasked portions of the second silicon dioxide layer with an impurity having a conductivity type that is opposite the conductivity type of the source region and the drain region;

etching the second polysilicon layer and the second silicon dioxide layer from the substrate except for a continuous first portion of the second polysilicon layer extending from the control gate region to the channel region over the first polysilicon layer and, except for a second portion of the second polysilicon layer contacting the control gate region and spaced apart from the continuous portion of the first polysilicon layer and from the continuous portion of the second polysilicon layer; and wherein the continuous portion of the first polysilicon layer and the continuous portion of the second polysilicon layer define a floating gate.

14. The method according to claim 13 wherein the first polysilicon layer depositing step comprises the step of depositing the first polysilicon layer to a thickness of approximately 500 angstroms, and wherein the second polysilicon layer depositing step comprises the step of depositing the second polysilicon layer to a thickness of approximately 4500 angstroms.

15. The method according to claim 13 further comprising the steps of, after the first polysilicon layer implanting step and prior to the second polysilicon layer etching step, in sequence:

unmasking the second silicon dioxide layer;

masking the second silicon dioxide layer for covering the floating gate and for exposing portions of the second silicon dioxide layer disposed over a portion of the second polysilicon layer which contacts the control gate region; and implanting the second polysilicon layer a second time through the unmasked portions of the second silicon dioxide layer with an impurity having a conductivity type that is the same as the conductivity type of the source region and the drain region.

16. The method according to claim 15 further comprising the steps of, after the second polysilicon layer implanting step and prior to the second polysilicon layer etching step, in sequence:

unmasking the first silicon dioxide layer;

forming a third silicon dioxide layer over the second silicon dioxide layer; and annealing the first and second implants.

17. The method according to claim 16 further comprising the step of, after the annealing step and prior to the second polysilicon layer etching step:

removing the second silicon dioxide layer and the third silicon dioxide layer except the portions of the second and third silicon dioxide layer covering the floating gate.

18. The method according to claim 17 further comprising the step of, after the second silicon dioxide layer and third silicon dioxide layer removing step and prior to the second polysilicon layer etching step, in sequence:

forming a fourth silicon dioxide layer over the portion of the second polysilicon layer contacting the control gate region; and blanket coating the substrate with a silicon nitride layer.

19. The method according to claim 18 wherein the first polysilicon layer depositing step comprises the step of depositing the first polysilicon layer to a thickness of approximately 500 angstroms, and wherein the second polysilicon layer depositing step comprises the step of depositing the second polysilicon layer to a thickness of approximately 4500 angstroms.

* * * * *